US008549376B1

(12) United States Patent
Ahmed et al.

(10) Patent No.: US 8,549,376 B1
(45) Date of Patent: Oct. 1, 2013

(54) VECTOR TURBO CODES

(75) Inventors: Syed Asim Ahmed, Iowa City, IA (US); John H. Gass, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 1081 days.

(21) Appl. No.: 12/001,818

(22) Filed: Dec. 13, 2007

(51) Int. Cl.
*H03M 13/29* (2006.01)
*H03M 13/01* (2006.01)

(52) U.S. Cl.
USPC .......................................... 714/755; 714/786

(58) Field of Classification Search
None
See application file for complete search history.

(56) References Cited

U.S. PATENT DOCUMENTS

| | | | | |
|---|---|---|---|---|
| 6,553,535 B1 * | 4/2003 | Asada et al. | | 714/777 |
| 6,799,295 B2 * | 9/2004 | Nguyen | | 714/794 |
| 7,764,743 B2 * | 7/2010 | Farag | | 375/265 |
| 2002/0087923 A1 * | 7/2002 | Eroz et al. | | 714/702 |
| 2002/0136332 A1 * | 9/2002 | Dielissen et al. | | 375/341 |
| 2002/0147954 A1 * | 10/2002 | Shea | | 714/755 |
| 2002/0170016 A1 * | 11/2002 | Inoue et al. | | 714/787 |
| 2005/0111376 A1 * | 5/2005 | Raghothaman et al. | | 370/252 |

* cited by examiner

*Primary Examiner* — Ajay Bhatia
*Assistant Examiner* — Dipakkumar Gandhi
(74) *Attorney, Agent, or Firm* — Donna P. Suchy; Daniel M. Barbieri (57) ABSTRACT

The present disclosure is directed to a system and method for error correction utilizing turbo code and signal transmission with error correction utilizing turbo code. A sequence of data is divided into a plurality of elements. Each element is encoded separately in parallel utilizing turbo encoding and decoded separately in parallel utilizing turbo decoding. The encoding and decoding of each element may be performed by an encoder and a decoder dedicated to that respective element. The control mechanism that controls each encoder and decoder may be identical, similar to a SIMD (single instruction, multiple data) architecture, allowing each element to be encoded and decoded separately in parallel utilizing turbo encoding and decoding. The encoding and decoding of each element separately in parallel utilizing turbo encoding and decoding may utilize the same interleaver permutation.

12 Claims, 8 Drawing Sheets

VECTOR TURBO CODES

FIELD OF THE INVENTION

The present disclosure relates generally to communication systems and more particularly to error correction in communication systems.

BACKGROUND OF THE INVENTION

The transmission of signals is subject to interference by noise in the transmission channel. Noise refers to fluctuations in the stream of information conveyed in a transmitted signal as received by a receiver, as well as the addition of external factors in the stream of information. Interference by noise impedes the interpretation of information contained within the transmitted signal. Error correction may be utilized to remove the effects of noise from a transmitted signal so that the information contained within the transmitted signal can be obtained. Forward error correction encodes transmitted signals with redundant data to enable a receiver to correct errors in the signal caused by noise without requiring the retransmission of the signal. The noisy-channel coding theorem establishes that a transmission channel, however corrupted by noise, may be utilized to transmit information free of errors up to a maximum rate through the transmission channel by utilizing error correction.

Turbo codes are a class of high-performance error correction codes. Turbo codes enable signal transmission to come very close to the theoretical maximum information transfer rate over a transmission channel which includes noise. Turbo codes utilize likelihood data based on the encoding of a transmitted signal to generate probabilistic hypotheses regarding errors in the signal. Turbo codes enable increases in the rate of information transmitted in a signal without increasing the signal power, or decreases of signal power used to transmit information at the same rate.

SUMMARY OF THE INVENTION

The present disclosure is directed to a system and method for error correction utilizing turbo code and signal transmission with error correction utilizing turbo code.

A sequence of data is divided into a plurality of elements. Each element of the plurality of elements is encoded separately in parallel utilizing turbo encoding. Each element of the plurality of elements is decoded separately in parallel utilizing turbo decoding.

The encoding of each element of the plurality of elements separately in parallel utilizing turbo encoding may be performed by an encoder dedicated to that respective element of the plurality of elements. The control mechanism that controls each encoder may be identical, similar to a SIMD (single instruction, multiple data) architecture, allowing each element of the plurality of elements to be encoded separately in parallel utilizing turbo encoding.

The decoding of each element of the plurality of elements separately in parallel utilizing turbo decoding may be performed by a decoder dedicated to that respective element of the plurality of elements. The control mechanism that controls each decoder may be identical, similar to a SIMD architecture, allowing each element of the plurality of elements to be decoded separately in parallel utilizing turbo decoding.

The encoding of each element of the plurality of elements separately in parallel utilizing turbo encoding and the decoding of each element of the plurality of elements separately in parallel utilizing turbo decoding may utilize the same interleaver permutation. The encoding of each element of the plurality of elements separately in parallel utilizing turbo encoding may be performed utilizing a semiconductor device including, but not limited to, a FPGA (field-programmable gate array) and/or an ASIC (application specific integrated circuit). The decoding of each element of the plurality of elements separately in parallel utilizing turbo decoding may be performed utilizing a semiconductor device including, but not limited to, a FPGA and/or an ASIC.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous objects and advantages of the present invention may be better understood by those skilled in the art by reference to the accompanying figures in which.

DETAILED DESCRIPTION OF THE INVENTION

Reference will now be made in detail to exemplary embodiments of the disclosure, examples of which are illustrated in the accompanying drawings.

Turbo codes are relatively complex. Thus, though turbo codes enable signal transmission to come very close to the theoretical maximum information transfer rate over a transmission channel which includes noise, they add latency to signal transmission caused by the time required to process the turbo codes. Longer codewords provide more error correction strength. However, implementation complexity of turbo codes grows at a higher rate than the speed of the turbo code in bits per second. Thus, the implementation complexity of turbo codes grows exponentially as the bit length of the codeword is increased. The strength of the codeword utilized in turbo codes may be limited by the highest clock rate available in a FPGA (field-programmable gate array) or an ASIC (application specific integrated circuit) as the FPGA or ASIC may only be able to process a certain number of bits per second.

Figure 1:
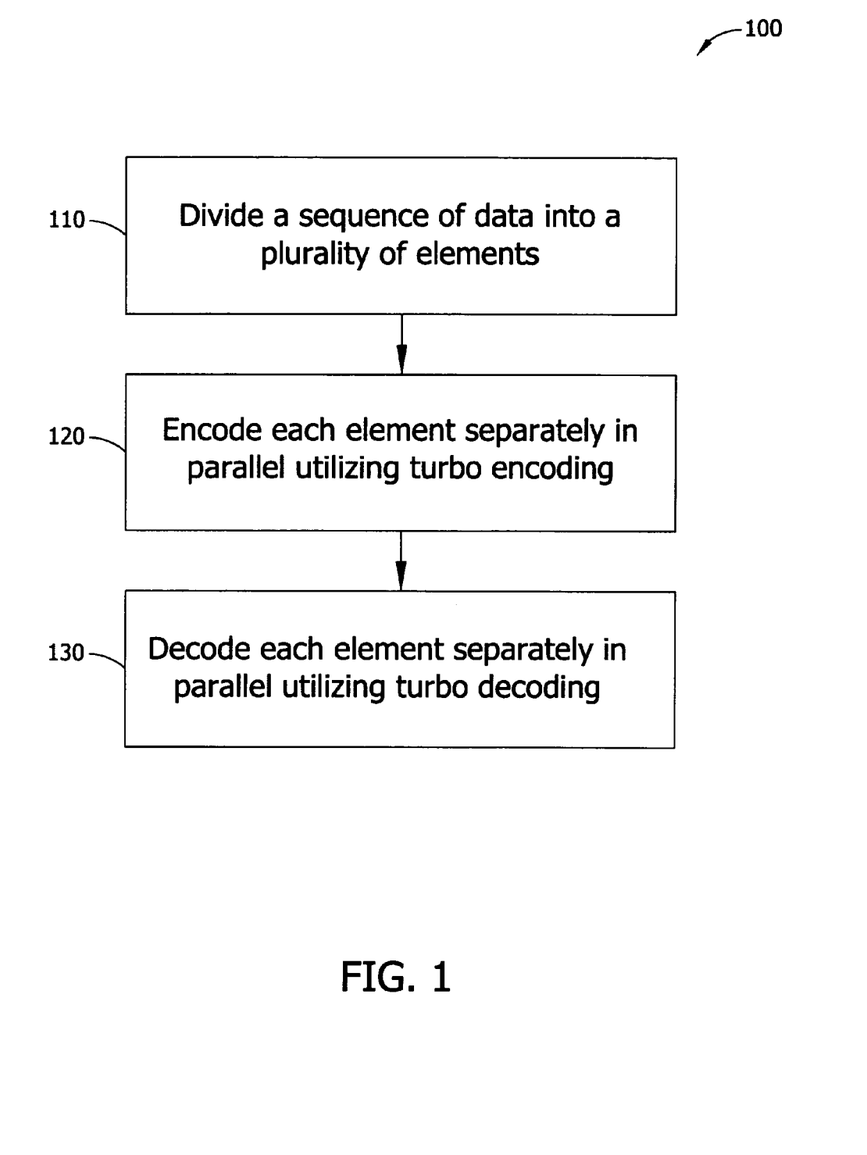
FIG. 1 is a flow chart illustrating a method of error correction utilizing turbo code, in accordance with an exemplary embodiment of the present disclosure.

Referring now to FIG. 1; a method 100 of error correction utilizing turbo code, in accordance with an exemplary embodiment of the present disclosure, is shown. In step 110, a sequence of data is divided into a plurality of elements. In step 120, each element of the plurality of elements is encoded separately in parallel utilizing turbo encoding. The encoding of each element of the plurality of elements separately in parallel utilizing turbo encoding may be performed by an encoder dedicated to that respective element of the plurality of elements. The control mechanism that controls each encoder may be identical, similar to a SIMD (single instruction, multiple data) architecture, allowing each element of the plurality of elements to be encoded separately in parallel utilizing turbo encoding. Thus, the sequence of data is divided into N sub sequences representing an N element turbo code and the N elements are encoded into an N element codeword separately in parallel. By treating the sequence of data as a vector of N elements the sequence of data still contains the same number of bits, though the N elements are able to be separately encoded in parallel. In step 130, each element of the plurality of elements is decoded separately in parallel utilizing turbo decoding. The decoding of each element of the plurality of elements separately in parallel utilizing turbo decoding may be performed by a decoder dedicated to that respective element of the plurality of elements. The control mechanism that controls each decoder may be identical, similar to a SIMD architecture, allowing each element of the plurality of elements to be decoded separately in parallel utilizing turbo decoding. Thus, the codeword is divided into N sub codewords representing an N element turbo code and the N elements are decoded separately in parallel. By treating the codeword as a vector of N elements the codeword still contains the same number of bits, though the N elements are able to be separately decoded in parallel.

By way of an example, a sequence of data may comprise 10,000 bits. The 10,000 bit sequence of data may be divided into 4 elements of 2500 bits each. The four 2500 bit elements may be encoded separately in parallel utilizing turbo encoding. Each 2500 bit element may be encoded separately in parallel utilizing turbo encoding by an encoder dedicated to that respective 2500 bit element. The four 2500 bit elements may be decoded separately in parallel utilizing turbo decoding. Each 2500 bit element may be decoded separately in parallel utilizing turbo decoding by a decoder dedicated to that respective 2500 bit element. The four 2500 bit elements may be combined after encoding. The four 2500 bit elements may be combined after encoding prior to transmission. The combined four 2500 bit elements may be divided again prior to decoding. The combined four 2500 bit elements may be divided again prior to decoding after reception. Note that this example is merely exemplary and is not intended to restrict the scope of the present disclosure. A sequence of data may comprise bit lengths other than 10,000, such as 5000 bits or 100,000 bits, without departing from the scope of the present disclosure. A sequence of data may be divided into different numbers of elements other than four, such as two, five, or seventeen without departing from the scope of the present disclosure.

The encoding of each element of the plurality of elements separately in parallel utilizing turbo encoding and the decoding of each element of the plurality of elements separately in parallel utilizing turbo decoding may utilize one or more interleavers. The encoding of each element of the plurality of elements separately in parallel utilizing turbo encoding and the decoding of each element of the plurality of elements separately in parallel utilizing turbo decoding may utilize the same interleaver permutation. The encoding of each element of the plurality of elements separately in parallel utilizing turbo encoding may be performed utilizing a semiconductor device including, but not limited to, a FPGA and/or an ASIC. The decoding of each element of the plurality of elements separately in parallel utilizing turbo decoding may be performed utilizing a semiconductor device including, but not limited to, a FPGA and/or an ASIC.

Figure 2:
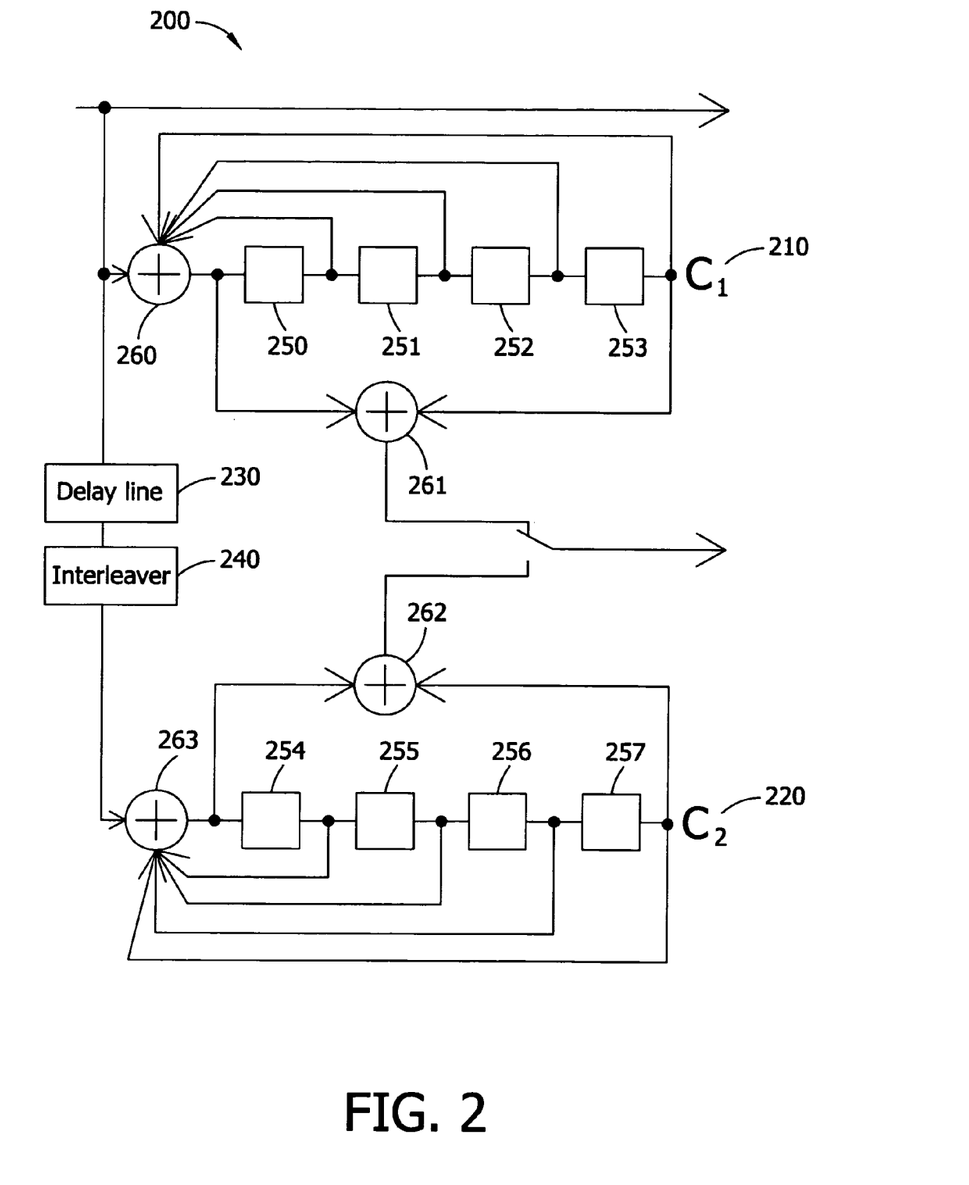
FIG. 2 is a diagram illustrating an architecture for a turbo encoder which may be utilized by the present disclosure, in accordance with an exemplary embodiment of the present disclosure.

Referring now to FIG. 2, an architecture for a turbo encoder 200 that may be utilized with the present invention is illustrated, in accordance with an exemplary embodiment of the present invention. The turbo encoder 200 comprises two identical coders 210 and 220 which are attached together utilizing parallel concatenation. The delay line 230 and the interleaver 240 force the input bits into different sequences via a series of registers 250-257 and combiners 260-263.

Figure 3:
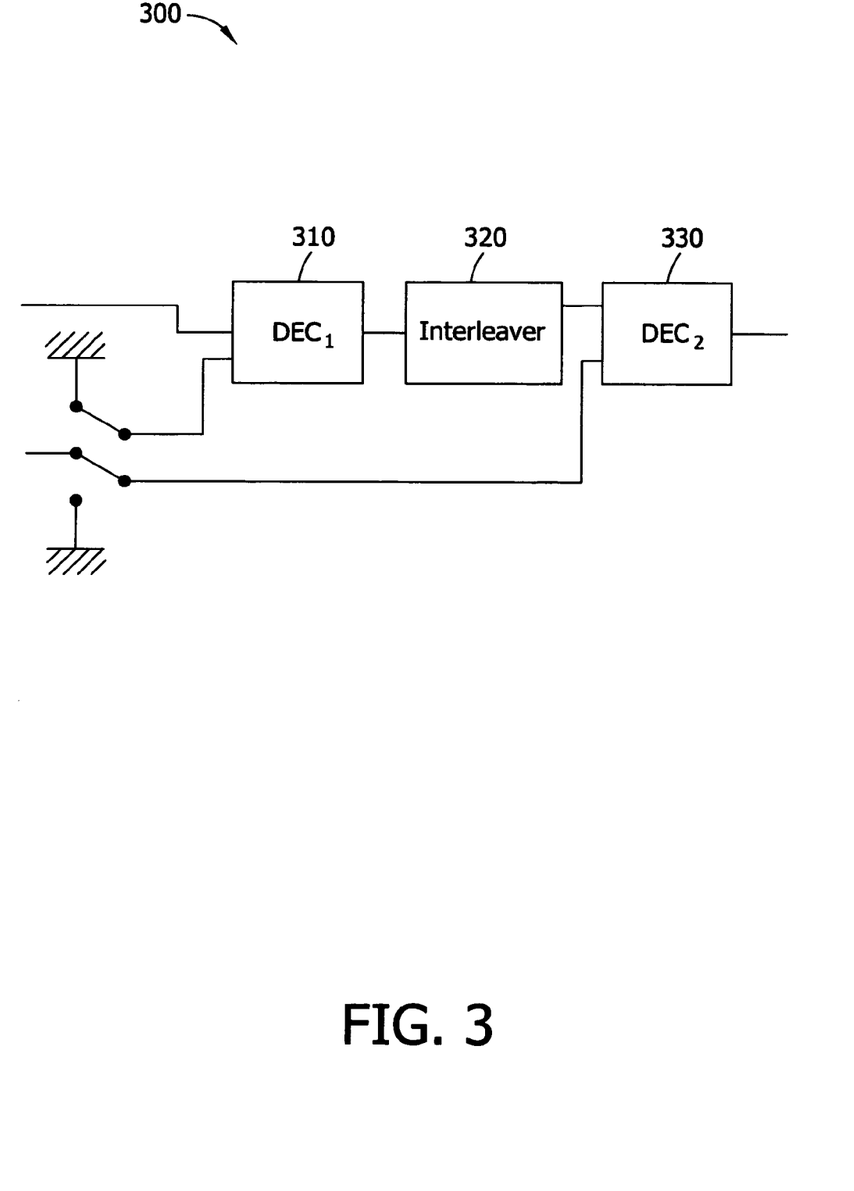
FIG. 3 is a diagram illustrating an architecture for a turbo decoder which may be utilized by the present disclosure, in accordance with an exemplary embodiment.

Referring now to FIG. 3, an architecture for a turbo decoder 300 that may be utilized with the present invention is illustrated, in accordance with an exemplary embodiment of the present invention. The turbo decoder 300 comprises decoders 310 and 330 which are connected together in serial via an interleaver 320 and via a feedback loop.

Figure 4:
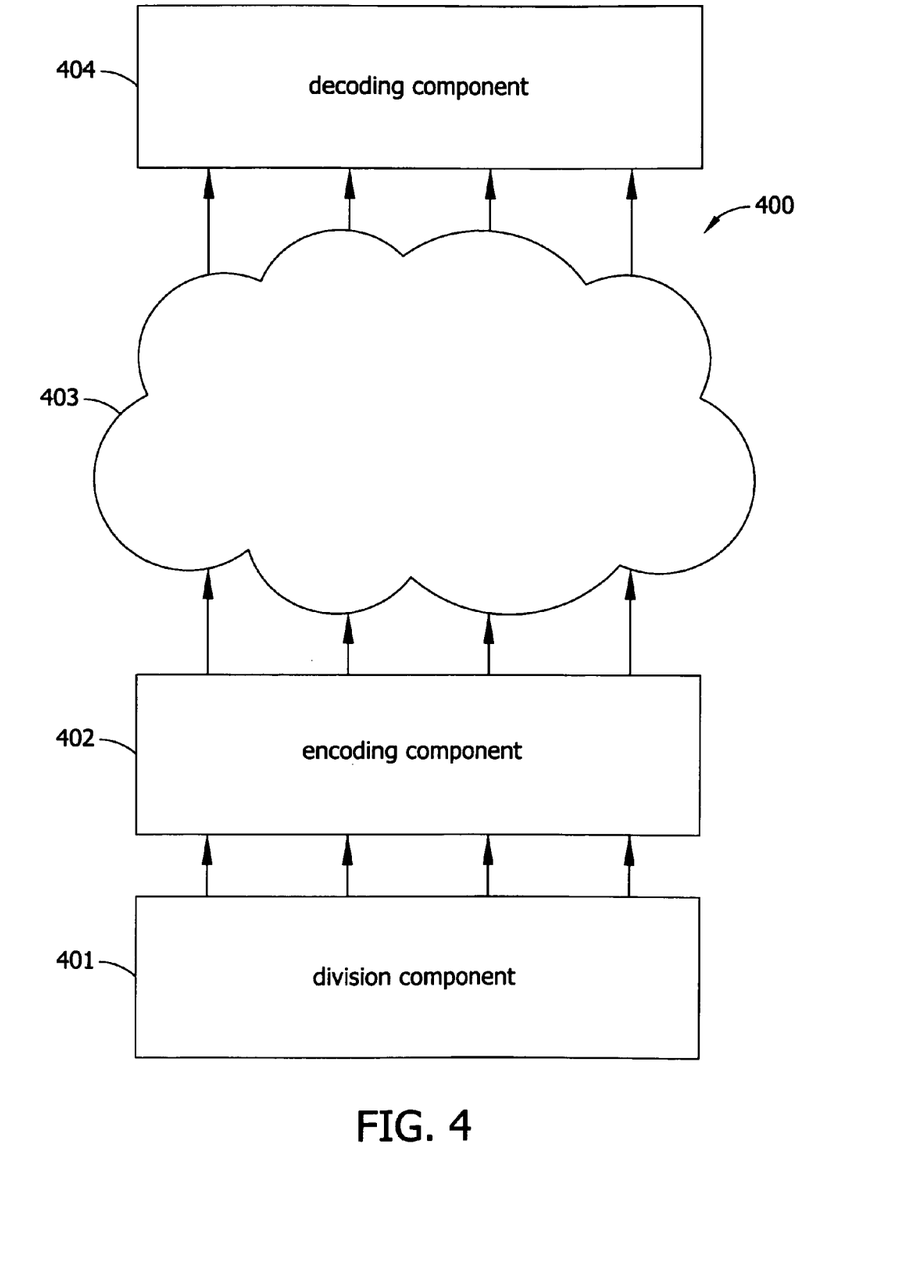
FIG. 4 a diagram illustrating a system for error correction utilizing turbo code, in accordance with an exemplary embodiment of the present disclosure.

Referring now to FIG. 4, a system 400 for error correction utilizing turbo code, in accordance with an exemplary embodiment of the present disclosure, is shown. The system 400 includes a division component 401, an encoding component 402, a connection media 403, and a decoding component 404. The division component 401 divides a sequence of data into a plurality of elements. The encoding component 402 encodes the plurality of elements separately in parallel utilizing turbo encoding. The encoding component 402 and the decoding component 404 may be communicably connected via the connection media 403. The connection media 403 may comprise any means of communication connection including, but not limited to, a transmission channel, a transmission medium such as wiring, radio waves, microwaves, infrared radiation, light waves, and/or fiber optic cable, and a communications network such as a cellular network, a satellite network, a telephone network, a local area network, and/or the Internet. The decoding component 404 decodes the plurality of elements separately in parallel utilizing turbo encoding.

Figure 5:
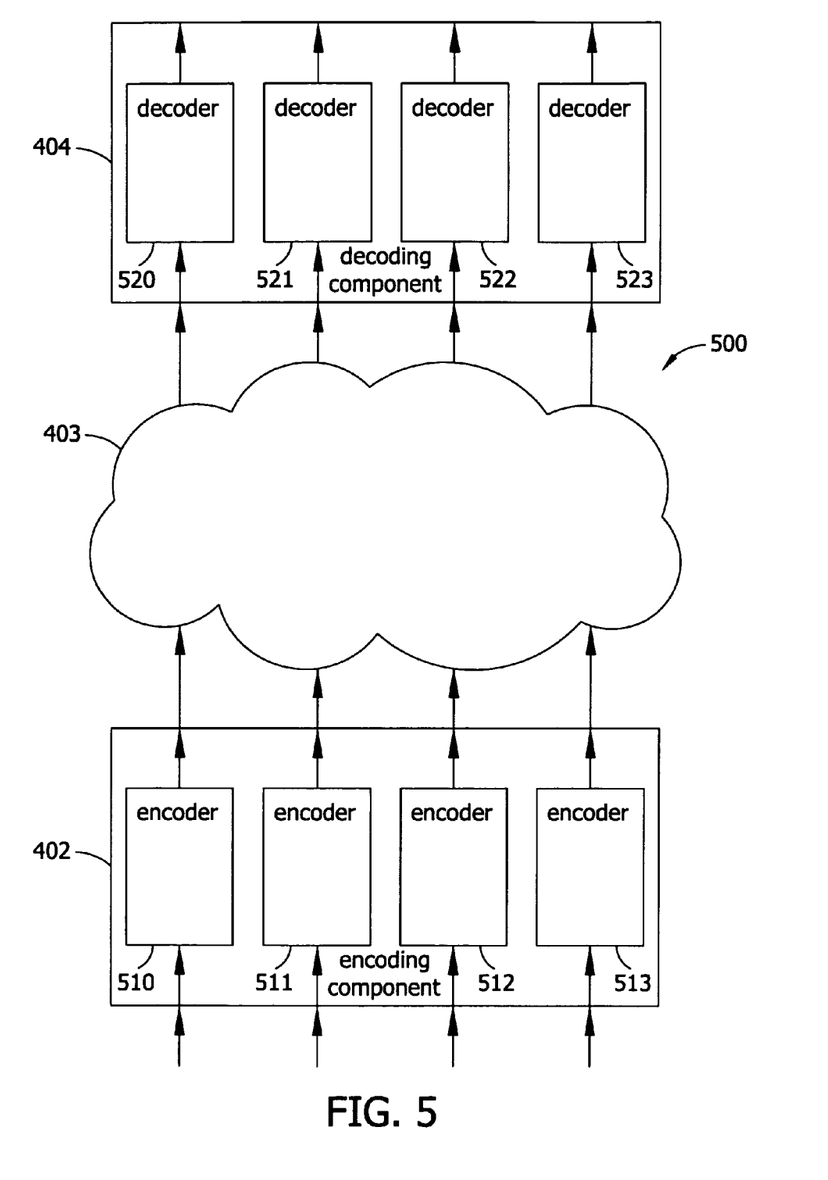
FIG. 5 is a diagram illustrating a detail view of a system for error correction utilizing turbo code, in accordance with an exemplary embodiment of the present disclosure.

Referring now to FIG. 5, a detail view of the encoder component 402, the connection media 403, and the decoder component 404 of FIG. 4 is illustrated. The encoding component 402 may comprise an encoder 510-513 dedicated to each element of the plurality of elements that encodes the respective element of the plurality of elements utilizing turbo encoding. Though the encoding component 402 is shown comprising 4 encoders 510-513, the encoding component 402 may comprise other numbers of encoders 510-513 without departing from the scope of the present disclosure, such as 2, 15, or 25. The control mechanism of the encoding component 402 that controls each encoder 510-513 may be identical, similar to a SIMD architecture, allowing each element of the plurality of elements to be encoded separately in parallel utilizing turbo encoding. Thus, the sequence of data is divided into N sub sequences representing an N element turbo code by the division component 401 and the N elements are encoded into an N element codeword separately in parallel by the encoding component 402. By treating the sequence of data as a vector of N elements the sequence of data still contains the same number of bits, though the N elements are able to be separately encoded in parallel. The decoding component 404 may comprise a decoder 520-523 dedicated to each element of the plurality of elements that decodes the respective element of the plurality of elements utilizing turbo encoding. Though the decoding component 404 is shown comprising 4 decoders 520-523, the decoding component 404 may comprise other numbers of decoders 520-523 without departing from the scope of the present disclosure, such as 2, 15, or 25. The control mechanism of the decoding component 404 that controls each decoder 520-523 may be identical, similar to a SIMD architecture, allowing each element of the plurality of elements to be decoded separately in parallel utilizing turbo decoding. Thus, the codeword is divided into N sub codewords representing an N element turbo code by the division component 401 and the N elements are decoded separately in parallel by the decoding component 404. By treating the codeword as a vector of N elements the codeword still contains the same number of bits, though the N elements are able to be separately decoded in parallel.

By way of an example, a sequence of data may comprise 10,000 bits. The division component 401 may divide a 10,000 bit sequence of data into 4 elements of 2500 bits each. The encoding component 402 may encode each of the four 2500 bit elements separately in parallel utilizing turbo encoding. The encoding component 402 may encode each of the four 2500 bit elements separately in parallel utilizing turbo encoding by utilizing an encoder 510-513 dedicated to that respective 2500 bit element. The decoding component 404 may decode each of the four 2500 bit elements separately in parallel utilizing turbo decoding. The decoding component 404 may decode each of the four 2500 bit elements separately in parallel utilizing turbo encoding by utilizing a decoder 520-523 dedicated to that respective 2500 bit element. The four 2500 bit elements may be combined after encoding prior to transmission. The combined four 2500 bit elements may be divided again prior to decoding after reception. Note that this example is merely exemplary and it not intended to restrict the scope of the present disclosure. A sequence of data may comprise bit lengths other than 10,000, such as 5000 bits or 100,000 bits, without departing from the scope of the present disclosure. The division component 401 may divide a sequence of data into different numbers of elements other than four, such as two, five, or seventeen without departing from the scope of the present disclosure.

The encoding component 402 and/or the encoders 510-513 may utilize one or more interleavers. The decoding component 404 and/or the decoders 520-523 may utilize one or more interleavers. The encoding component 402 and/or the encoders 510-513 may utilize the same interleaver permutation as the decoding component 404 and/or the decoders 520-523. The encoding component 402 and/or the encoders 510-513 may be incorporated in a semiconductor device including, but not limited to, a FPGA and/or an ASIC. The decoding component 404 and/or the decoders 520-523 may be incorporated in a semiconductor device including, but not limited to, a FPGA and/or an ASIC. The system 400 may utilize the architecture for a turbo encoder 200 depicted in FIG. 2. The system 400 may utilize the architecture for a turbo decoder 300 depicted in FIG. 3.

Figure 6:
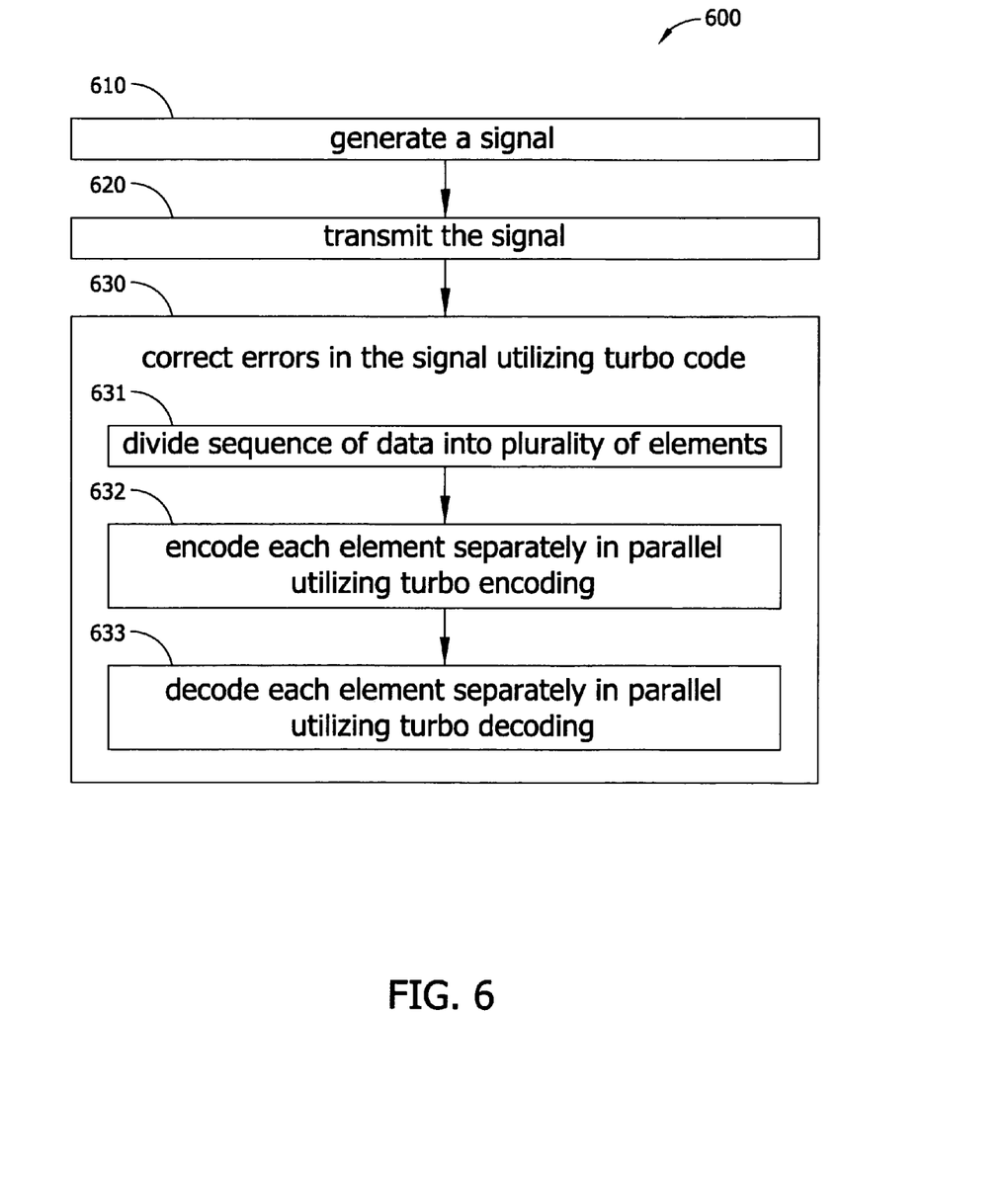
FIG. 6 is a flow chart illustrating a method of signal transmission, in accordance with an alternative embodiment of the present disclosure.

Referring now to FIG. 6; a method 600 of signal transmission, in accordance with an alternative embodiment of the present disclosure, is shown. In step 610, a signal is generated. In step 620, the signal is transmitted. In step 630, errors in the signal are corrected utilizing turbo code. Step 630 may comprise steps 631-633. In step 631, a sequence of data is divided into a plurality of elements. In step 632, each element of the plurality of elements is encoded separately in parallel utilizing turbo encoding. The encoding of each element of the plurality of elements separately in parallel utilizing turbo encoding is performed prior to transmission of the signal. The encoding of each element of the plurality of elements separately in parallel utilizing turbo encoding may be performed by an encoder dedicated to that respective element of the plurality of elements. The control mechanism that controls each encoder may be identical, similar to a SIMD architecture, allowing each element of the plurality of elements to be encoded separately in parallel utilizing turbo encoding. Thus, the sequence of data is divided into N sub sequences representing an N element turbo code and the N elements are encoded into an N element codeword separately in parallel. By treating the sequence of data as a vector of N elements the sequence of data still contains the same number of bits, though the N elements are able to be separately encoded in parallel. In step 633, each element of the plurality of elements is decoded separately in parallel utilizing turbo decoding. The decoding of each element of the plurality of elements separately in parallel utilizing turbo decoding may be performed after transmitting the signal. The decoding of each element of the plurality of elements separately in parallel utilizing turbo decoding may be performed by a decoder dedicated to that respective element of the plurality of elements. The control mechanism that controls each decoder may be identical, similar to a SIMD architecture, allowing each element of the plurality of elements to be decoded separately in parallel utilizing turbo decoding. Thus, the codeword is divided into N sub codewords representing an N element turbo code and the N elements are decoded separately in parallel. By treating the codeword as a vector of N elements the codeword still contains the same number of bits, though the N elements are able to be separately decoded in parallel.

By way of an example, a sequence of data may comprise 10,000 bits. The 10,000 bit sequence of data may be divided into 4 elements of 2500 bits each. The four 2500 bit elements may be encoded separately in parallel utilizing turbo encoding. Each 2500 bit element may be encoded separately in parallel utilizing turbo encoding by an encoder dedicated to that respective 2500 bit element. The four 2500 bit elements may be decoded separately in parallel utilizing turbo decoding. Each 2500 bit element may be decoded separately in parallel utilizing turbo decoding by a decoder dedicated to that respective 2500 bit element. The four 2500 bit elements may be combined after encoding prior to transmission. The combined four 2500 bit elements may be divided again prior to decoding. The combined four 2500 bit elements may be divided again prior to decoding after reception. Note that this example is merely exemplary and is not intended to restrict the scope of the present disclosure. A sequence of data may comprise bit lengths other than 10,000, such as 5000 bits or 100,000 bits, without departing from the scope of the present disclosure. A sequence of data may be divided into different numbers of elements other than four, such as two, five, or seventeen without departing from the scope of the present disclosure.

The encoding of each element of the plurality of elements separately in parallel utilizing turbo encoding and the decoding of each element of the plurality of elements separately in parallel utilizing turbo decoding may utilize one or more interleavers. The encoding of each element of the plurality of elements separately in parallel utilizing turbo encoding and the decoding of each element of the plurality of elements separately in parallel utilizing turbo decoding may utilize the same interleaver permutation. The encoding of each element of the plurality of elements separately in parallel utilizing turbo encoding may be performed utilizing a semiconductor device including, but not limited to, a FPGA and/or an ASIC. The decoding of each element of the plurality of elements separately in parallel utilizing turbo decoding may be performed utilizing a semiconductor device including, but not limited to, a FPGA and/or an ASIC. The encoding of each element of the plurality of elements separately in parallel utilizing turbo encoding may utilize the architecture for a turbo encoder 200 depicted in FIG. 2. The decoding of each element of the plurality of elements separately in parallel utilizing turbo decoding may utilize the architecture for a turbo decoder 300 depicted in FIG. 3.

Figure 7:
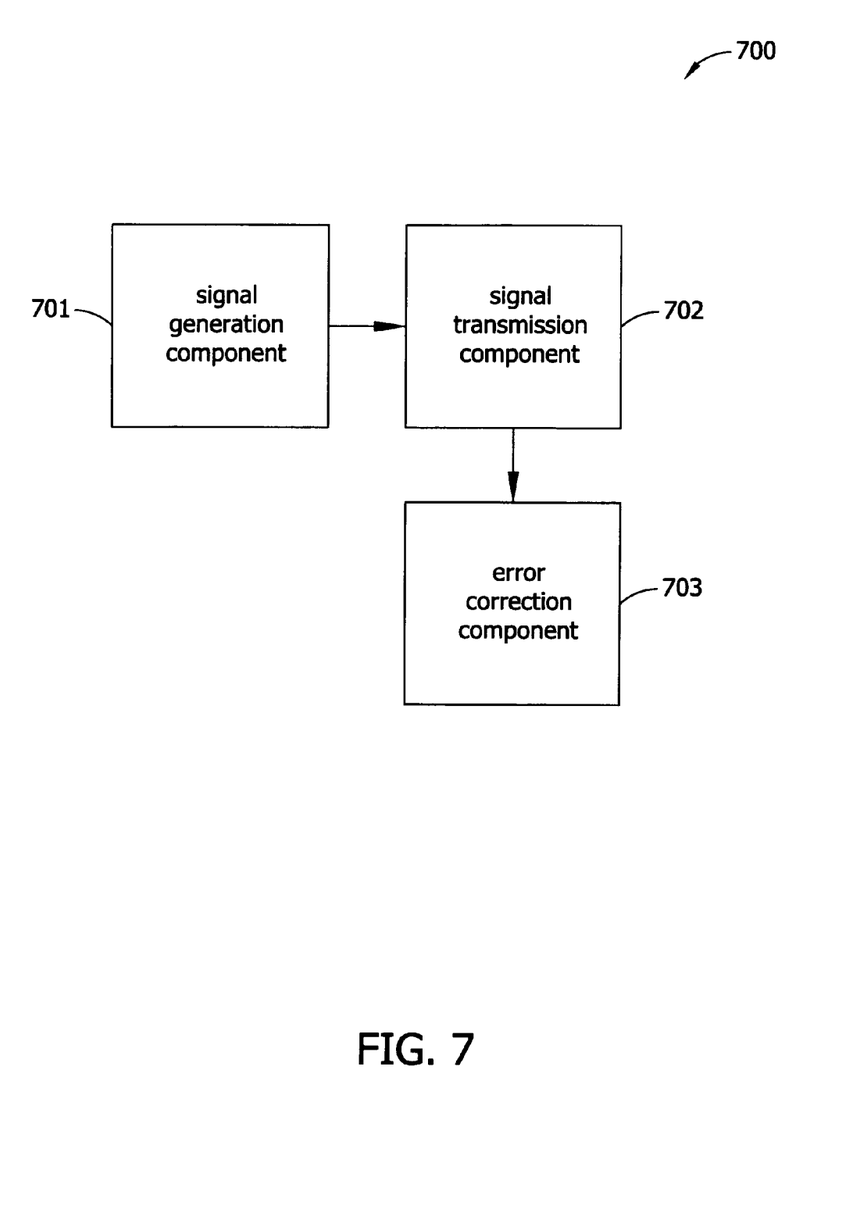
FIG. 7 is a diagram illustrating a system for signal transmission, in accordance with an exemplary embodiment of the present disclosure.

Referring now to FIG. 7, a system 700 for signal transmission, in accordance with an exemplary embodiment of the present disclosure, is shown. The system 700 includes a signal generation component 701, a signal transmission component 702, and an error correction component 703. The signal generation component 701 may generate a signal. The signal transmission component 702 may transmit the signal. The error correction component 703 may correct errors in the signal.

Figure 8:
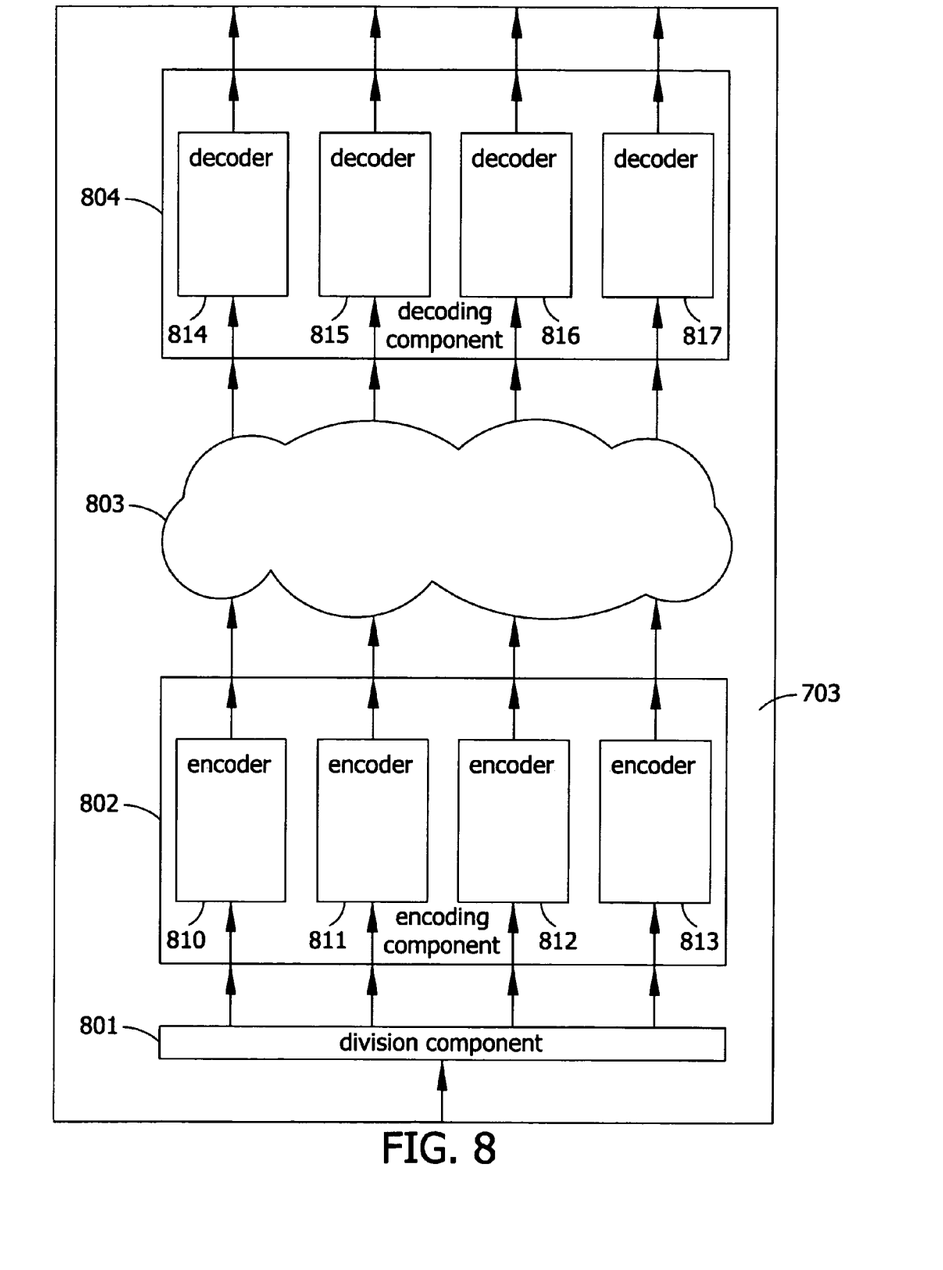
FIG. 8 is a diagram illustrating a detail view of a system for signal transmission, in accordance with an exemplary embodiment of the present disclosure.

Referring now to FIG. 8, a detail view of the error correction component 703 of FIG. 7 is illustrated. The error correction component 703 may comprise a division component 801, an encoding component 802, a connection media 803, and a decoding component 804. The division component 801 may divide a sequence of data into a plurality of elements. The encoding component 802 may encode the plurality of elements separately in parallel utilizing turbo encoding. The encoding component 802 may encode the plurality of elements separately in parallel utilizing turbo encoding prior to transmission. The encoding component 802 and the decoding component 804 may be communicably connected via the connection media 803. The connection media 803 may comprise any means of communication connection including, but not limited to, a transmission channel, a transmission medium such as wiring, radio waves, microwaves, infrared radiation, light waves, and/or fiber optic cable, and a communications network such as a cellular network, a satellite network, a telephone network, a local area network, and/or the Internet. The decoding component 804 may decode the plurality of elements separately in parallel utilizing turbo encoding subsequent to transmission. The encoding component 802 may comprise an encoder 810-813 dedicated to each element of the plurality of elements that encodes the respective element of the plurality of elements utilizing turbo encoding. Though the encoding component 802 is shown comprising 4 encoders 810-813, the encoding component 802 may comprise other numbers of encoders 810-813 without departing from the scope of the present disclosure, such as 2, 15, or 25. The control mechanism of the encoding component 802 that controls each encoder 810-813 may be identical, similar to a SIMD architecture, allowing each element of the plurality of elements to be encoded separately in parallel utilizing turbo encoding. Thus, the sequence of data may be divided into N sub sequences representing an N element turbo code by the division component 801 and the N elements are encoded into an N element codeword separately in parallel by the encoding component 802. By treating the sequence of data as a vector of N elements the sequence of data still contains the same number of bits, though the N elements are able to be separately encoded in parallel. The decoding component 804 may comprise a decoder 820-823 dedicated to each element of the plurality of elements that decodes the respective element of the plurality of elements utilizing turbo encoding. Though the decoding component 804 is shown comprising 4 decoders 820-823, the decoding component 804 may comprise other numbers of decoders 820-823 without departing from the scope of the present disclosure, such as 2, 15, or 25. The control mechanism of the decoding component 804 that controls each decoder 820-823 may be identical, similar to a SIMD architecture, allowing each element of the plurality of elements to be decoded separately in parallel utilizing turbo decoding. Thus, the codeword may be divided into N sub codewords representing an N element turbo code by the division component 801 and the N elements are decoded separately in parallel by the decoding component 804. By treating the codeword as a vector of N elements the codeword still contains the same number of bits, though the N elements are able to be separately decoded in parallel.

By way of an example, a sequence of data may comprise 10,000 bits. The division component 801 may divide a 10,000 bit sequence of data into 4 elements of 2500 bits each. The encoding component 802 may encode each of the four 2500 bit elements separately in parallel utilizing turbo encoding. The encoding component 802 may encode each of the four 2500 bit elements separately in parallel utilizing turbo encoding by utilizing an encoder 810-813 dedicated to that respective 2500 bit element. The decoding component 804 may decode each of the four 2500 bit elements separately in parallel utilizing turbo encoding. The decoding component 804 may decode each of the four 2500 bit elements separately in parallel utilizing turbo encoding by utilizing a decoder 820-823 dedicated to that respective 2500 bit element. The four 2500 bit elements may be combined after encoding prior to transmission. The combined four 2500 bit elements may be divided again prior to decoding. The combined four 2500 bit elements may be divided again prior to decoding after reception. Note that this example is merely exemplary and it not intended to restrict the scope of the present disclosure. A sequence of data may comprise bit lengths other than 10,000, such as 5000 bits or 100,000 bits, without departing from the scope of the present disclosure. The division component 801 may divide a sequence of data into different numbers of elements other than four, such as two, five, or seventeen without departing from the scope of the present disclosure.

The encoding component 802 and/or the encoders 810-813 may utilize an interleaver. The decoding component 804 and/or the decoders 820-823 may utilize one or more interleavers. The encoding component 802 and/or the encoders 810-813 may utilize the same interleaver permutation as the decoding component 804 and/or the decoders 820-823. The encoding component 802 and/or the encoders 810-813 may be incorporated in a semiconductor device including, but not limited to, a FPGA and/or an ASIC. The decoding component 804 and/or the decoders 820-823 may be incorporated in a semiconductor device including, but not limited to, a FPGA and/or an ASIC. The error correction component 703 may utilize the architecture for a turbo encoder 200 depicted in FIG. 2. The error correction component 703 may utilize the architecture for a turbo decoder 300 depicted in FIG. 3.

It is understood that the present invention is not limited to any underlying implementing technology. The present invention may be implemented utilizing any combination of software and hardware technology. The present invention may be implemented using a variety of technologies without departing from the scope and spirit of the invention or without sacrificing all of its material advantages.

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method of error correction utilizing turbo code, comprising the steps of:
    dividing a sequence of data into a plurality of elements;
    encoding each element in the plurality of elements separately in parallel utilizing turbo encoding; and
    decoding each element in the plurality of elements separately in parallel utilizing turbo decoding, wherein the encoding each element in the plurality of elements separately in parallel utilizing turbo encoding utilizes at least one interleaver permutation and the decoding each element in the plurality of elements separately in parallel utilizing turbo decoding utilizes the same interleaver permutation, the encoding each element in the plurality of elements separately in parallel utilizing turbo encoding is performed utilizing one selected from a field-programmable gate array and an application specific integrated circuit and the decoding each element in the plurality of elements separately in parallel utilizing turbo decoding is performed utilizing one selected from a field-programmable gate array and an application specific integrated circuit.

2. The method of claim 1, wherein the encoding each element in the plurality of elements separately in parallel utilizing turbo encoding is performed utilizing a dedicated encoder for each element in the plurality of elements.

3. The method of claim 1, wherein the decoding each element in the plurality of elements separately in parallel utilizing turbo decoding is performed utilizing a dedicated decoder for each element in the plurality of elements.

4. A system for error correction utilizing turbo code, comprising:
    a division component for dividing a sequence of data into a plurality of elements;
    an encoding component for encoding each element in the plurality of elements utilizing turbo encoding; and
    a decoding component for decoding each element in the plurality of elements utilizing turbo decoding; wherein the encoding component encodes each element in the plurality of elements separately in parallel and the decoding component decodes each element in the plurality of elements separately in parallel, the encoding component utilizes an interleaver permutation and the decoding component utilizes the same interleaver permutation, the encoding component is incorporated into one selected from a field-programmable gate array and an application specific integrated circuit and the decoding component is incorporated into one selected from a field-programmable gate array and an application specific integrated circuit, the encoding component includes at least four dedicated encoders wherein each dedicated encoder of said at least four dedicated encoders encodes at least a 2500 bit element, the decoding component includes at least four dedicated decoders wherein each dedicated decoder of said at least four dedicated decoders decodes at least a 2500 bit element.

5. A method of signal transmission, comprising the steps of:
    generating a signal;
    transmitting the signal; and
    correcting errors in the signal utilizing turbo code, comprising:
        dividing a sequence of data into a plurality of elements;
        encoding each element in the plurality of elements separately in parallel utilizing turbo encoding; and
    decoding each element in the plurality of elements separately in parallel utilizing turbo decoding, wherein the encoding each element in the plurality of elements separately in parallel utilizing turbo encoding utilizes an interleaver permutation and the decoding each element in the plurality of elements separately in parallel utilizing turbo decoding utilizes the same interleaver permutation, the encoding each element in the plurality of elements separately in parallel utilizing turbo encoding is performed utilizing one selected from a field-programmable gate array and an application specific integrated circuit and the decoding each element in the plurality of elements separately in parallel utilizing turbo decoding is performed utilizing one selected from a field-programmable gate array and an application specific integrated circuit.

6. The method of claim 5, wherein the encoding each element in the plurality of elements separately in parallel utilizing turbo encoding is performed utilizing a dedicated encoder for each element in the plurality of elements.

7. The method of claim 5, wherein the decoding each element in the plurality of elements separately in parallel utilizing turbo decoding is performed utilizing a dedicated decoder for each element in the plurality of elements.

8. A system for signal transmission, comprising:
    a signal generation component for generating a signal;
    a signal transmission component for transmitting the signal; and
    an error correction component for correcting errors in the signal utilizing turbo code, comprising:
        a division component for dividing a sequence of data into a plurality of elements;
        an encoding component for encoding each element in the plurality of elements utilizing turbo encoding; and
        a decoding component for decoding each element in the plurality of elements utilizing turbo decoding;
        wherein the encoding component encodes each element in the plurality of elements separately in parallel and the decoding component decodes each element in the plurality of elements separately in parallel;
    wherein the signal transmission component transmits a signal generated by the signal generation component and the error correction component corrects errors in the signal utilizing turbo code, the encoding component utilizes an interleaver permutation and the decoding component utilizes the same interleaver permutation, the encoding component is incorporated into one selected from a field-programmable gate array and an application specific integrated circuit and the decoding component is incorporated into one selected from a field-programmable gate array and an application specific integrated circuit.

9. The system of claim 8, wherein the encoding component includes a dedicated encoder for each element in the plurality of elements which encodes the respective element in the plurality of elements.

10. The system of claim 9, wherein the encoding component includes at least four dedicated encoders wherein each dedicated encoder of said at least four dedicated encoders encodes at least a 2500 bit element.

11. The system of claim 9, wherein the decoding component includes at least four dedicated decoders wherein each dedicated decoder of said at least four dedicated decoders decodes at least a 2500 bit element.

12. The system of claim 8, wherein the decoding component includes a dedicated decoder for each element in the plurality of elements which decodes the respective element in the plurality of elements.

* * * * *